United States Patent
Jan

(10) Patent No.: US 8,809,984 B2
(45) Date of Patent: Aug. 19, 2014

(54) SUBSTRATE CONNECTION TYPE MODULE STRUCTURE

(75) Inventor: Shin-Dar Jan, Hsinchu (TW)

(73) Assignee: Larview Technologies Corporation, Yangmei, Taoyuan County (TW)

( * ) Notice: Subject to any disclaimer, the term of this patent is extended or adjusted under 35 U.S.C. 154(b) by 0 days.

(21) Appl. No.: 13/565,553

(22) Filed: Aug. 2, 2012

(65) Prior Publication Data

US 2014/0035078 A1    Feb. 6, 2014

(51) Int. Cl.
*H01L 31/0232* (2014.01)
*H01L 21/00* (2006.01)

(52) U.S. Cl.
USPC .......................... 257/432; 438/64

(58) Field of Classification Search
CPC ............ H01L 23/3114; H01L 23/49805; H01L 24/01; H01L 33/48; H01L 2221/68313; H01L 2223/54486; H01L 2224/01; H01L 2224/04105; H01L 2224/12105; H01L 2224/28105; H01L 2924/18301
USPC .................. 257/431, 432, 680, 700
See application file for complete search history.

(56) References Cited

U.S. PATENT DOCUMENTS

| | | | |
|---|---|---|---|
| 2006/0145325 A1* | 7/2006 | Yang et al. | 257/680 |
| 2007/0096280 A1* | 5/2007 | Tu et al. | 257/680 |
| 2007/0269205 A1* | 11/2007 | Lee et al. | 396/542 |
| 2008/0173792 A1* | 7/2008 | Yang et al. | 250/208.1 |
| 2010/0010312 A1* | 1/2010 | Gilad et al. | 600/160 |

* cited by examiner

*Primary Examiner* — Julio J Maldonado
*Assistant Examiner* — Moin Rahman
(74) *Attorney, Agent, or Firm* — Chih Feng Yeh; Huntington IP Consulting Co., Ltd.

(57) ABSTRACT

The present invention provides a substrate connection type module structure comprising a substrate with a through hole structure and a first contact pad. A chip is configured on the through hole structure of the substrate, with a second contact pad and a sensing area. The first contact pad is coupled to the second contact pad via a wire. A second substrate is electrically connected to the first substrate. The second substrate and the chip are located at the same layer. A lens holder is disposed on the substrate, and a lens is located on the top of the lens holder. A transparent material is disposed within the lens holder. The lens is substantially aligning to the transparent material and the sensing area.

16 Claims, 4 Drawing Sheets

SUBSTRATE CONNECTION TYPE MODULE STRUCTURE

TECHNICAL FIELD

The present invention generally relates to semiconductor device structure, more particularly, to a substrate connection type module structure by integrating a substrate, a lens holder and an image sensor to reduce the device size.

BACKGROUND

In the field of semiconductor devices, the device density is increased and the device dimension is reduced, continuously. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor chip become more complicated, the traditional package technique, for example lead frame package, flex package, rigid package technique, can't meet the demand of producing smaller chip with high density elements on the chip. Wafer level package (WLP) technique is an advanced packaging technology, by which the dice are manufactured and tested on the wafer, and then the wafer is singulated by dicing for assembly in a surface-mount line. Because the wafer level package technique utilizes the whole wafer as one object, not utilizing a single chip or die, and therefore, before performing a scribing process, packaging and testing has been accomplished. Furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Currently, the flip chip technology used for the camera module is performed as a stud bump process on the entire wafer by a wire bonding equipment, whereby solder balls to being replaced by the stud bumps.

A CMOS image sensor is manufactured into a CMOS image sensor module from a CMOS image sensor chip by an electronic package technology. And it is applied into various goods and a package specification required by the CMOS image sensor module depends on characteristics of the finished goods. Especially, the recent tendencies of a CMOS image sensor module, namely, high electricity capabilities, miniaturization/high density, a low power consumption, multifunction, a high speed signal processing, a reliability are the representative characteristics of a miniaturization of the electronic goods.

Contrary to general CMOS chips, the CMOS image sensor in the past is feasible to a physical environment and can be polluted by the impurities, and a leadless chip carrier LCC type package is used when its size is not considered to be important. However, in a recent tendency of a market requiring for thin and simplified characteristics such as in a camera phone, smart phone, chip-on-board (COB), chip-on-film (COF), chip size package (CSP), etc. are generally used.

Current flip chip structure can reduce module height but flip chip machine is very expensive and low UPH (Unit Per Hour). So, the investment is very huge. And, yield is lower and not easy to be controlled.

Therefore, based-on the shortcomings of prior arts, the present invention provide a newly substrate connection type module structure, which has no need for new investment and the process yield will be better.

SUMMARY OF THE INVENTION

Based-on the shortcomings of the above-mentioned, an objective of the present invention is to provide a substrate connection type module structure with a smaller height of the module structure.

Another objective of the present invention is to provide a substrate connection type module structure by integrating a substrate, a lens holder and an image sensor to reduce the device size, and enhancing yield and reliability.

Yet another objective of the present invention is to provide a substrate connection type module structure with good thermal performance, lower cost and easy to manufacture.

According to an aspect of the present invention, the present invention provides a substrate connection type module structure. The module structure comprises a first substrate, with a through hole structure and a first contact pad. A chip is configured on the substrate, with a second contact pad and a sensing area. The first contact is coupled to the second contact pad via a wire. The substrate and the chip are the same level or layer. A transparent material is disposed on the lens holder. A lens holder is disposed on the substrate, and a lens is located on the top of the lens holder, substantially aligning to the transparent material and the sensing area.

A first portion of the substrate, the chip and the lens holder construct a cubic module structure, and a second portion of the substrate extending to outside of the cubic module structure. The first portion and the second portion of the substrate are a printed circuit board or a flexible printed circuit board, and wherein the printed circuit board or the flexible printed circuit board has its trace formed thereon, respectively. The lens holder is adhered to the substrate via an adhesion layer.

The module structure further comprises a first adhesion layer formed a lower surface of the chip and the substrate, and a material layer for the first adhesion layer formed thereon. Material of the material layer comprises a heat dissipation (sink) material, non-transparent material or anti-EMI (electromagnetic interference) material, and the combination thereof.

The module structure further comprises a second adhesion layer formed on a lower surface of the chip and on a top surface of the first adhesion layer.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figure 1:
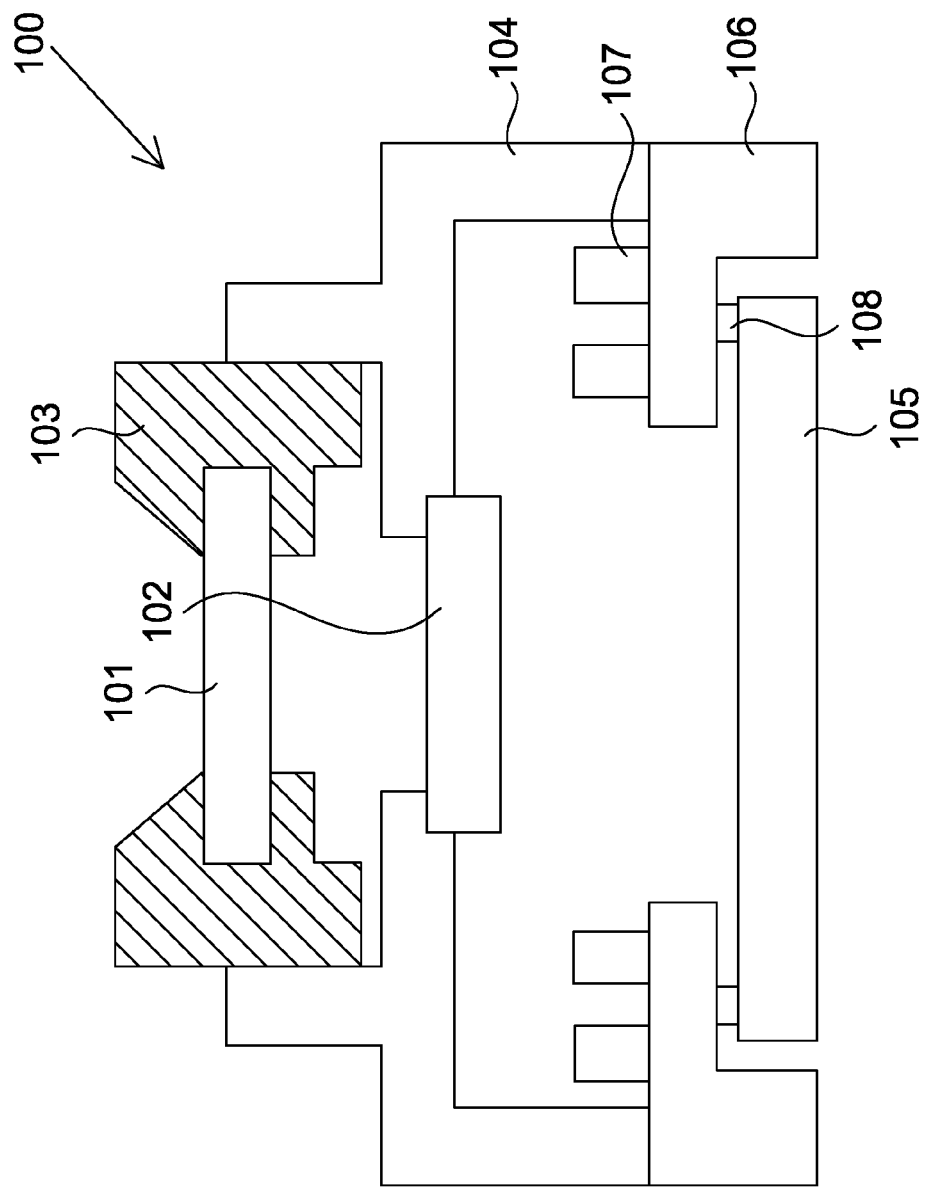
FIG. 1 illustrates a sectional view of a flip chip package structure.

FIG. 1 shows a sectional view of a flip chip package structure. As shown in FIG. 1, the flip chip package structure 100 comprises a substrate 106, a chip 105, a passive component 107, a lens holder 104, a lens 101 and a transparent plate (material) 102. The substrate 106 has a concave structure formed therein for receiving the chip 105 and a conductive layer 108. The chip 105 and the conductive layer 108 are formed under the substrate 106, wherein the conductive layer 108 is electrically connected to the substrate 106 and a contact pad of the chip 105. The lens holder 104 includes a jig 103 for fixing the lens 101. At least one passive component 107 is formed (adhered) on the substrate 106 within the lens holder 104. The lens 101 is disposed on the upper portion of the lens holder 104. Moreover, the transparent plate 102 is optionally disposed within the lens holder 104, between the lens 101 and the chip 105. The lens holder 104 is adhered to the substrate 106 via an adhesion layer.

Figure 2:
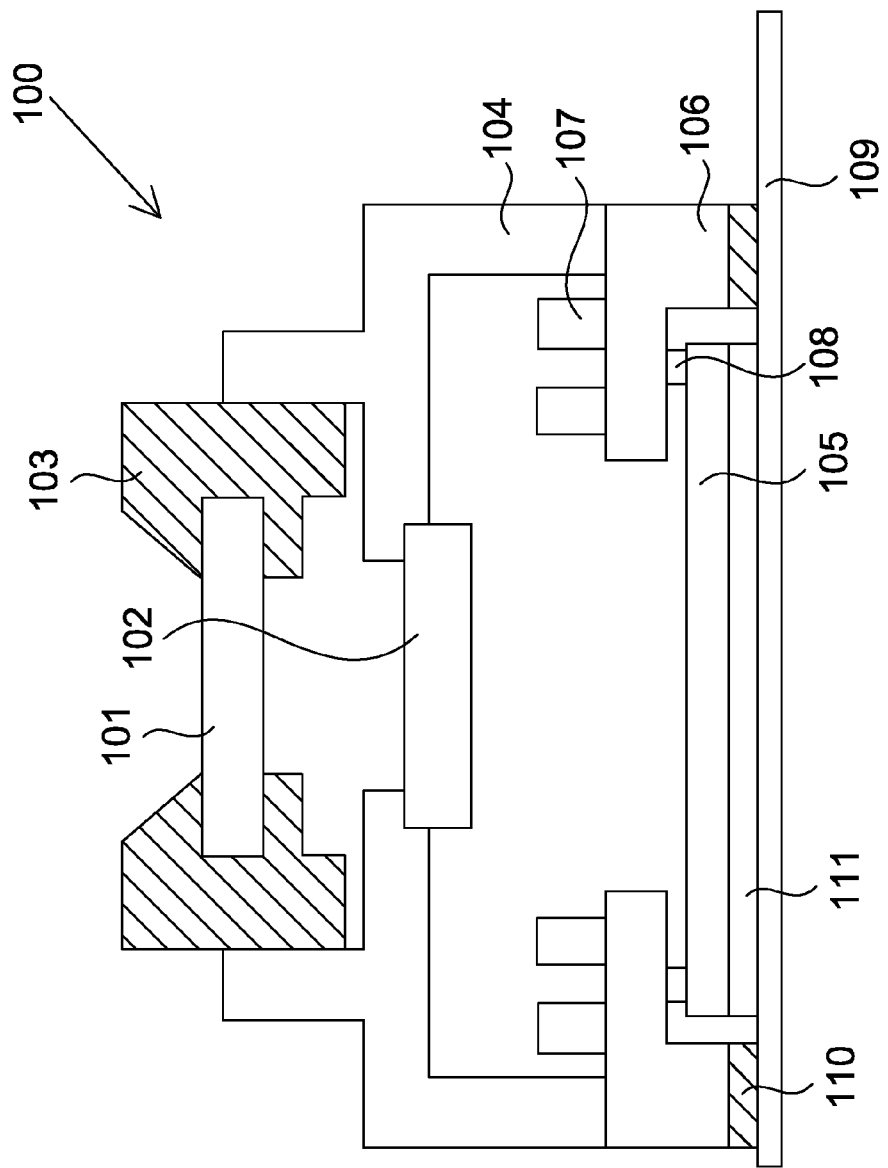
FIG. 2 illustrates a sectional view of a flip chip package structure.

FIG. 2 shows a sectional view of another example of a flip chip package structure. As shown in FIG. 2, the flip chip package structure 100 further comprises a printed circuit board 109 with a conductive wire for electrically connecting to other device, a conductive layer 110 and a heat dissipation layer 111. The heat dissipation layer 111 is formed between the chip 105 and the printed circuit board 109 for facilitating heat dissipation. The substrate 106 is adhered to the printed circuit board 109 via the conductive layer 110 for electrically connecting to each other.

The present invention provides a substrate connection type module structure, wherein the substrate and the chip are the same level or layer, and thus has a smaller height of the module structure and easy to manufacture. In the substrate connection type module structure, the substrate is an integral structure which a portion is located within the cubic module structure, and another portion is located outside of the cubic module structure. The substrate may be a mixed type printed circuit board (a printed circuit combined with a flexible printed circuit board), an integral printed circuit board or an integral flexible printed circuit board.

Figure 3:
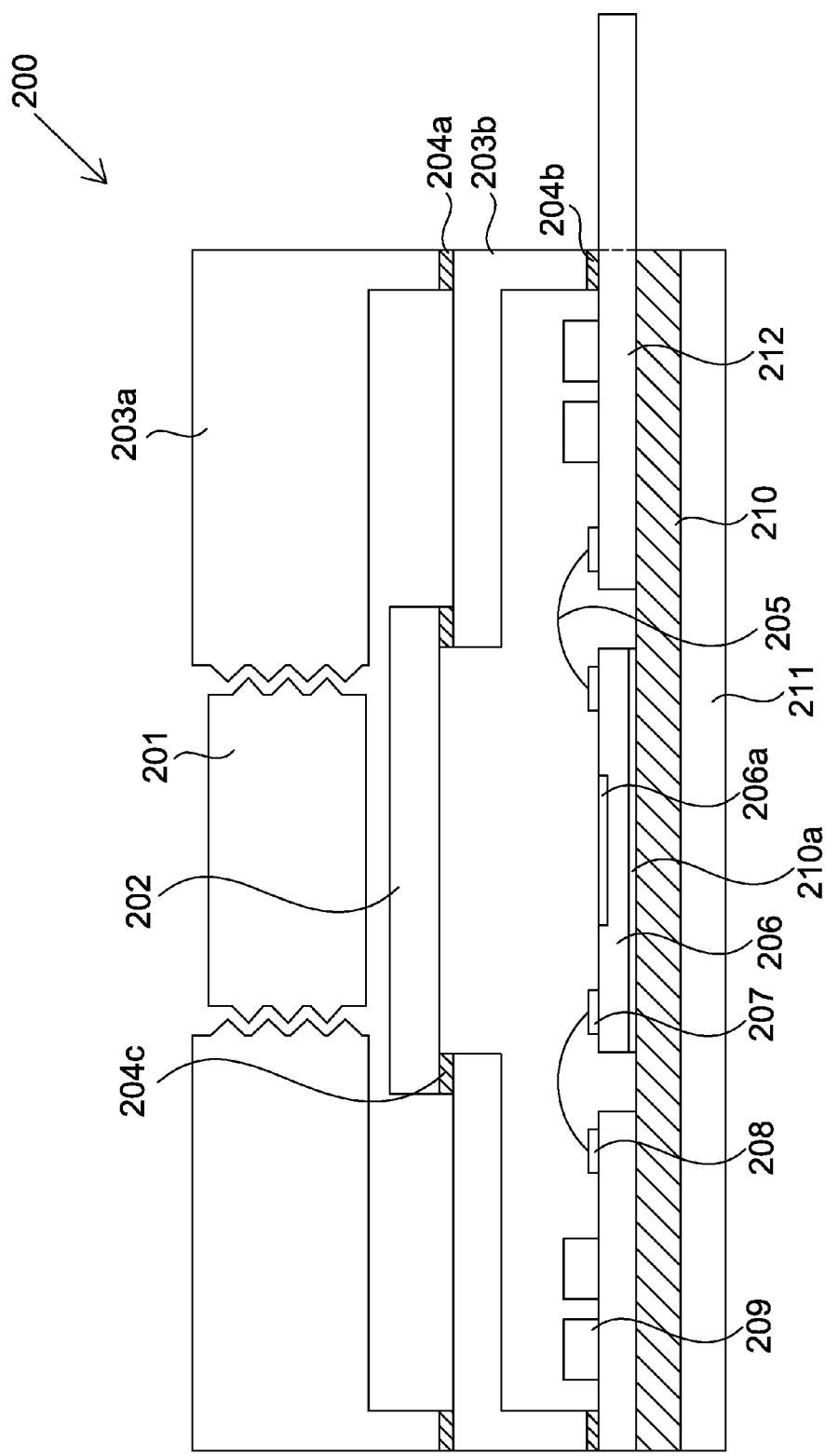
FIG. 3 illustrates a sectional view of a substrate connection type module structure according to an embodiment of the present invention.

FIG. 3 shows a sectional view of a substrate connection type module structure by integrating a substrate, a lens holder and an image sensor chip according to the present invention. As shown in FIG. 3, the substrate connection type module structure 200 integrates a substrate, a lens holder and an image sensor chip to be as a module structure with sensing function, which may be applied to a camera module of a mobile phone or other portable devices. The substrate connection type module structure 200 comprises a substrate 212, a chip 206, an upper portion/lower portion of a lens holder 203a/203b, a lens 201 and a transparent plate (material) 202. The first portion of the substrate 212 is located in (embedded in) a cubic module structure, wherein a contact pad 208 and at least one component 209 are formed on the first portion of the substrate 212 of the cubic module structure. The at least one component 209 is electrically connected to the substrate 212. The substrate 212 is located at the bottom layer or the middle layer of the module structure, and the substrate 212 and the chip 206 are located at the same level (plane) or the identical layer. The at least one component 209 is for example an active component or a passive component; wherein the active component is a semiconductor integrated circuit (IC), and the passive component includes a capacitor or an inductor.

In the module structure 200, an adhesion layer 204a is formed on the lower portion 203b of the lens holder such that the bottom of the upper portion 203a is adhered to the lower portion 203b of the lens holder via the adhesion layer 204a.

As mentioned above, the first portion of the substrate 212 is embedded in the cubic module structure, and the contact pad 208 and at least one component 209 are formed on the substrate 212 of the cubic module structure. The second portion of the substrate 212 extends to outside of the cubic module structure, and trace (wire) on the second portion of the substrate 212 may be electrically connected to other component. The through hole structure located in the first portion of the substrate 212 may be used for receiving or accommodating the chip 206 such that it can be disposed therein. In an example, the trace of the substrate 212 may be formed in and/or outside of the cubic module structure.

In one embodiment, the through hole structure is generally located at the middle of the substrate 212, and size of the substrate 212 is larger than that of the chip 206. For example, the through hole structure is formed within the substrate 212 by employing a punching or drilling process. In this embodiment, based-on the substrate 212 with the through hole structure formed therein, it equivalent to open a window area at the substrate 212. There is no overlapping area between the substrate 212 and the chip 206, and therefore the adhesion layer is no need between these two layers. It can save the manufacturing process.

The second portion of the substrate 212 is located outside of the while cubic module structure, and thus the substrate 212 can extend to outside of the cubic module structure. Based-on the substrate 212 extending to outside of the cubic module structure, electrical signals of the module structure 200 can be transmitted to other components outside of the cubic module structure via the trace of the substrate 212. In one embodiment, the substrate 212 may be a mixed type printed circuit board (a printed circuit combined with a flexible printed circuit board), an integral printed circuit board or an integral flexible printed circuit board. For example, the first portion of the substrate 212 is a printed circuit board, and the second portion of the substrate 212 is a flexible printed circuit board (FPC), or these two portions are integral printed circuit board or flexible printed circuit board.

The chip 206 and the substrate 212 are located at the same level (plane) or the identical layer. The chip 206 is disposed in the through hole structure, and the sensing area 206a and the contact pad (I/O pad) 207 are exposing to the window area. In one embodiment, an adhesion layer 210a is formed on backside of the chip 206 for facilitating a subsequent adhesion process. Moreover, backside of the chip 206 and the first portion of the substrate 212 are adhered to (on) another adhesion layer 210, and the second portion of the substrate 212 is located outside of the adhesion layer 210. In other words, based-on the adhesion layer 210a formed on backside of the chip 206, it can enhance the adhesion force between the chip 206 and the adhesion layer 210. In an example, the contact pad 207 on the chip 206 is electrically connected to the contact pad 208 on the substrate 212. For example, the chip 206 is an image sensor chip, which has a sensing area 206a on its surface and a contact pad 207 formed thereon.

A wire 205 is electrically connected to the contact pad 207 of the substrate 212 and the contact pad 208 of the chip 206, which may be performed by a wire bonding process. The contact pad 208 is formed on the wire bonding area of the substrate 212. Due to the chip 206 and the substrate 212 located at the same level (plane) or the identical layer, the wire bonding process may be simpler.

A transparent plate 202 is directly adhered to the lower portion 203b of the lens holder via an adhesion layer 204c; the transparent plate 202 is located above the substrate 212, for substantially aligning to the sensing area 206a. The transparent plate 202 is, for example a glass substrate or the substrate made of a transparent material. Based-on the through hole structure, the propagating light passing through the transparent plate 202 may be directly reaching to the sensing area 206a. Size of the transparent plate 202 may be the same or larger than area of the sensing area 206a. The transparent plate (glass substrate) 202 may be round or square type. The transparent plate (glass substrate) 202 may be optionally coated infrared coating for filtering, such as infrared filter for filtering to a certain band of frequency by passing through the lens 201.

The upper portion 203a of the lens holder is adhered (holder mounted) on the lower portion 203b via an adhesion layer 204a to complete the module structure 200 of the present invention. The upper portion 203a of the lens holder may be a plastic piece or an actuator. Moreover, the upper portion 203a and the lower portion 203b of the lens holder may be integrated into an integral component. An adhesion layer 204b is formed on the substrate 212, and the lower portion 203b of the lens holder is adhered on the substrate 212 via the adhesion layer 204b. In one embodiment, size of the upper portion 203a of the lens holder, the lower portion 203b of the lens holder and the substrate 212 may be substantially the same, and therefore the lens holder, the transparent plate 202, the first portion of the substrate 212 and the image sensor chip 206 may be integrated into a cubic module structure.

The lens 201 is fixed to the upper portion 203a of the lens holder for supporting the lens 201. Moreover, the lens holder may be fixed to the substrate 212 for supporting the lens 201. The lens 201 may be optionally disposed above the lens holder. The module structure 200 of this embodiment, the transparent plate 202 may be optionally disposed within a concave structure or an accommodating space of the lens holder, and between the lens 201 and the chip 206. In other words, the lens 201 is substantially aligning to the transparent plate 202 and the chip 206, and thereby the propagating light directly reaching to the sensing area 206a.

Figure 4:
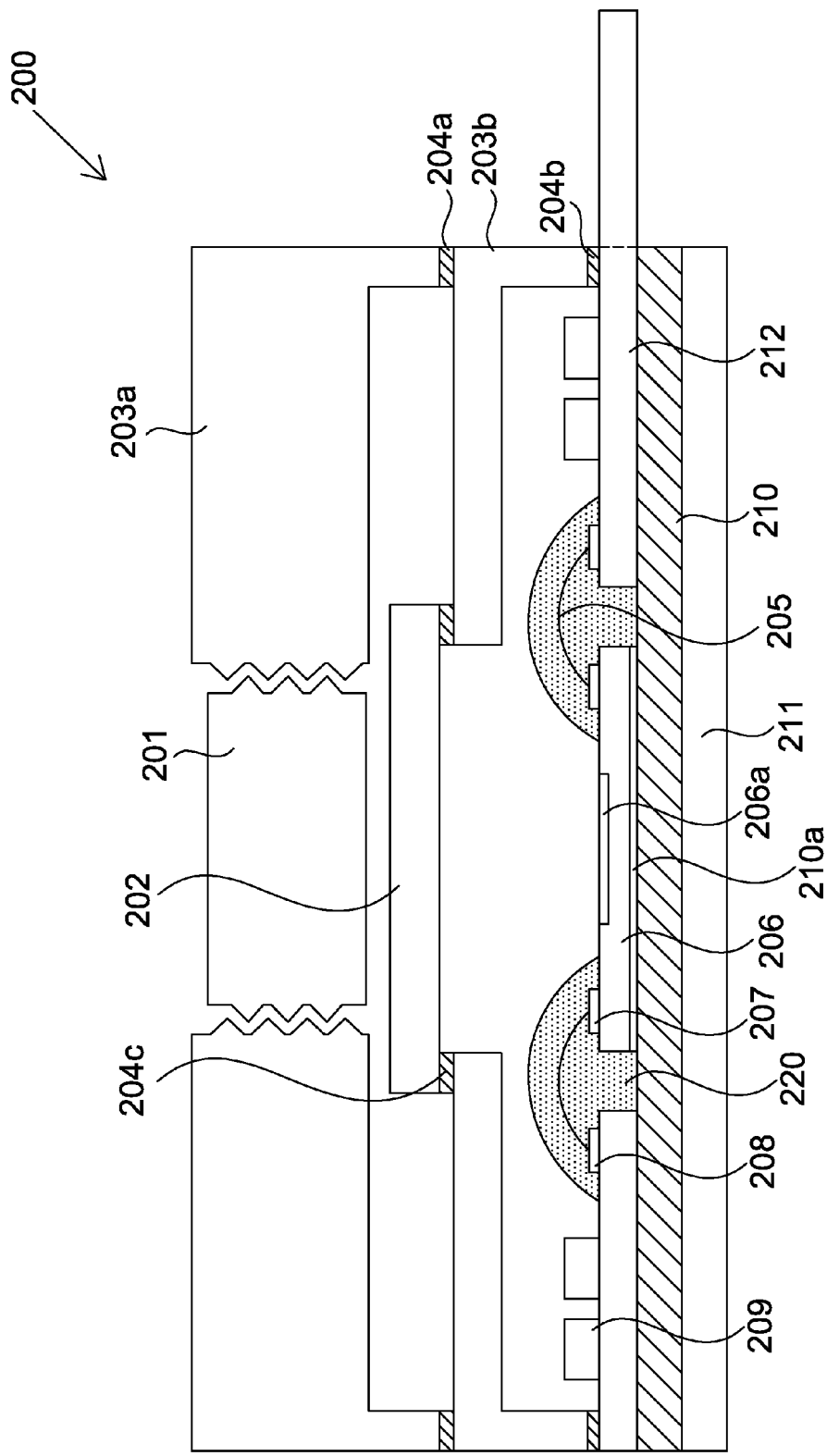
FIG. 4 illustrates a sectional view of a substrate connection type module structure according to another embodiment of the present invention.

Moreover, a passivation layer 220 may be formed on/between the chip 206 and the substrate 212 for fully-covering, partially-covering or non-covering over the wire 205, and filled into a gap between the chip 206 and the substrate 212, shown in FIG. 4. Material of the passivation layer 220 is for example glue.

In one embodiment, the substrate connection type module structure 200 further includes a material layer 211 formed on the lower surface of the adhesion layer 210, i.e. the bottom of the cubic module structure. Material of the material layer 211 is for example a heat dissipation (sink) material, non-transparent material or anti-EMI (electromagnetic interference) material, and the combination thereof.

In one embodiment of the present invention, the substrate 212 may be an organic substrate with a pre-determined through hole, and which material includes, for example epoxy type FR5 or FR4, or BT (Bismaleimide Triazine). Moreover, glass, ceramic and silicon may be as material of the substrate 212.

The advantages of the present invention comprises smaller height of the module structure, using current wire bonding process (electrical connect method) which is easy and cheap, good thermal performance and easy to manufacture multiple chip packaging.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. A substrate connection type module structure, comprising:
   a substrate, with a through hole structure and a first contact pad, wherein said through hole structure is located in a first portion of the substrate;
   a chip disposed in said through hole structure, with a second contact pad and a sensing area, and wherein said first contact pad is electrically connected to said second contact pad via a wire;
   wherein said substrate and said chip are located at the same level or layer and there is no overlapping area between said substrate and said chip; and
   a lens holder disposed on said substrate, and a lens located on said lens holder, substantially aligning to said sensing area;
   wherein said first portion of said substrate, said chip and said lens holder construct a cubic module structure, and a second portion of said substrate extending to outside of said cubic module structure.

2. The module structure of claim 1, wherein said first portion and said second portion of said substrate are a printed circuit board or a flexible printed circuit board, and wherein said printed circuit board or said flexible printed circuit board has its trace formed thereon, respectively.

3. The module structure of claim 1, wherein said lens holder is adhered to said substrate via an adhesion layer.

4. The module structure of claim 1, further comprising a first adhesion layer formed a lower surface of said chip and said substrate, and a material layer for said first adhesion layer formed thereon.

5. The module structure of claim 4, wherein material of said material layer comprises a heat dissipation (sink) material, non-transparent material or anti-EMI (electromagnetic interference) material, and the combination thereof.

6. The module structure of claim 4, further comprising a second adhesion layer formed on a lower surface of said chip and on a top surface of said first adhesion layer.

7. The module structure of claim 5, further comprising a second adhesion layer formed on a lower surface of said chip and on a top surface of said first adhesion layer.

8. The module structure of claim 5, further comprising a transparent material disposed on said lens holder.

9. The module structure of claim 8, wherein said first portion and said second portion of said substrate are a printed circuit board or a flexible printed circuit board, and wherein said printed circuit board or said flexible printed circuit board has its trace formed thereon, respectively.

10. The module structure of claim 8, wherein said lens holder is adhered to said substrate via an adhesion layer.

11. The module structure of claim 8, further comprising a passivation layer formed on said substrate and said chip.

12. The module structure of claim 1, further comprising a transparent material disposed on said lens holder.

13. The module structure of claim 12, wherein a first portion of said substrate, said chip and said lens holder construct a cubic module structure, and a second portion of said substrate extending to outside of said cubic module structure.

14. The module structure of claim 13, wherein said first portion and said second portion of said substrate are a printed circuit board or a flexible printed circuit board, and wherein said printed circuit board or said flexible printed circuit board has its trace formed thereon, respectively.

15. The module structure of claim 12, wherein said lens holder is adhered to said substrate via an adhesion layer.

16. The module structure of claim 12, further comprising a passivation layer formed on said substrate and said chip.

* * * * *